United States Patent [19]

Horner

[11] 3,995,343
[45] Dec. 7, 1976

[54] APPARATUS FOR PROCESSING A PRINTING PLATE

[75] Inventor: Ellwood J. Horner, Armonk, N.Y.

[73] Assignee: American Hoechst Corporation, Bridgewater, N.J.

[22] Filed: Jan. 29, 1975

[21] Appl. No.: 545,188

[52] U.S. Cl. .................................. 15/4; 15/77; 15/102; 354/297
[51] Int. Cl.$^2$ ................. A46B 13/04; G03D 13/00
[58] Field of Search .................. 15/77, 100, 102, 4; 134/122 R, 64 P; 354/317, 297, 318

[56] References Cited

UNITED STATES PATENTS

| | | | |
|---|---|---|---|
| 2,282,628 | 5/1942 | Whann et al. | 15/77 X |
| 2,313,606 | 3/1943 | Webb et al. | 15/77 |
| 2,726,414 | 12/1955 | Lindquist | 15/77 X |
| 3,090,069 | 5/1963 | Brewer et al. | 15/77 X |
| 3,809,105 | 5/1974 | Horner | 15/77 X |

Primary Examiner—Edward L. Roberts
Attorney, Agent, or Firm—James E. Bryan

[57] ABSTRACT

Apparatus for developing a printing plate, preferably a plate sensitized and imaged on both sides, including a pre-soak chamber containing a body of developer fluid, preferably a combination developer-finisher solution, and adapted to soften the areas of the plate coating to be removed as the plate passes through the chamber; a cleaning and scrubbing unit, including, a pair of rotatable brushes adapted to rotate in a direction opposite the direction that the plate travels through the apparatus, a pair of developer supply conduits mounted adjacent the brushes and behind the brushes, with respect to the direction of travel of the plate, and adapted to spray developer fluid on the bristles of the brushes at a time immediately before the latter contact the plate, a pair of deflectors mounted in contact with the brushes and ahead of the brushes, with respect to the direction of travel of the plate, and adapted to clean solid debris from the brushes and a pair of reciprocatable scrubber pads having a velour pad and conduits adapted to force developer fluid through the pads and onto the plate, and adapted to remove any remaining coating to be removed from the plate; a pair of transport rollers mounted behind the scrubber pads, with respect to the direction of travel of the plate, preferably having a surface which preferentially attracts particles of solid debris and removes them from the plate and, when a combination developer-finisher fluid is used, adapted to meter a thin layer of fluid on the plate; a pair of cleaning pads in contact with the transport rollers and mounted on the scrubber pads; and a drying means, preferably including a chamber and means for introducing hot air through the sides of the chamber.

7 Claims, 1 Drawing Figure

U.S. Patent  Dec. 7, 1976  3,995,343
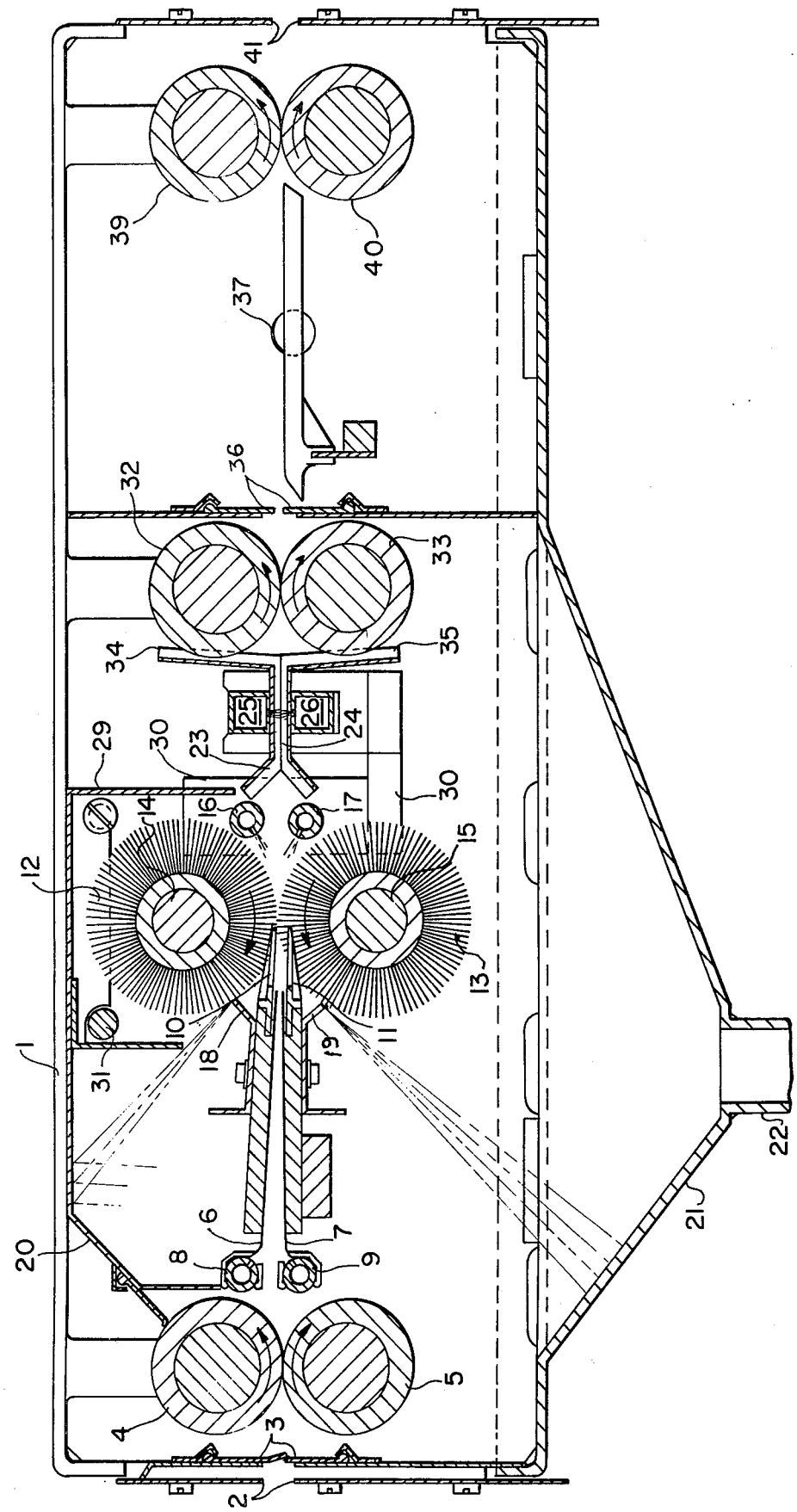

APPARATUS FOR PROCESSING A PRINTING PLATE

The invention relates to an apparatus for processing a printing plate, for example a planographic printing plate as is used in the lithographic printing process.

It has long been known in the lithographic industry that a subtractive presensitized offset printing plate may be developed by what is known as the "hand developing process." In this process, the carrier, which is usually a thin sheet of aluminum, is first coated by the manufacturer with a light-sensitive coating, usually containing, among other things, one or more resins, and the plate is then sold in the presensitized condition to the customer. Some printing plates are available with such a subtractive coating on two sides thereof. In this case, the customer exposes one side at a time, or, in suitable equipment, both sides simultaneously, through a master, to a source of strong actinic light, such as a carbon arc, for example. The light-sensitive coating when subjected to such a light is converted in such a manner that, after development, the image areas are retained on the plate surface and the non-image areas are removed. After development, for example by rubbing a developing agent into the surface of the plate by means of a sponge, the plate may be fixed and/or washed and finally a coating of gum arabic or similar material is applied to the surface of the plate to protect the image-free areas thereof. The plate is then ready for the printing press.

Where this hand developing process is employed to produce a printing plate, the following procedure is generally followed: From a typewritten set-up or make-up, equivalent to the material to be printed and provided in any desired manner with typed articles, pictures of various kinds of art work of different sizes and the like, all assembled onto a suitable cardboard or other support, a master is prepared in the conventional manner. The image of the master is then transferred onto the sensitized printing member, such as is described above, by a suitable exposure means.

The printing member thus prepared is then subjected to a developing operation using the "chemistry" prescribed by the manufacturer of the printing member. This "chemistry" is worked into the exposed coating by hand rubbing, for example with a sponge, and the non-image areas are subtracted or removed from the carrier leaving an exact replica of the image on the plate carrier. The printing member is then fixed and/or washed and a solution of gum arabic, or a similar solution, is applied to the plate surface, resulting in a printing plate which is ready for the press.

As described above, some plates have a light-sensitive coating on two sides of the carrier or support, thus resulting in advantages to the printer who is then able to print two different jobs from a single printing member. This means that each side of the printing member must be exposed, as described above, and each side must be hand developed and processed in a sink, as described above.

The disadvantages of hand development of offset printing plates are numerous. The process is slow and expensive. Uniformity of pressure in applying the developing solution to remove the undesired coating is almost impossible to attain and exposure to the developing solution is uneven. Thus, defective printing often results from an inadequate development or under-development of an area or from applying varying pressure by hand, which may adversely affect the desired printing image. Drying of the developer on certain portions of the plate before it can be rubbed in to remove the undesired coating also may leave a residue on the plate. A further difficulty with the hand method is in the application of the developing solution. It is presently the practice of the craftsman to pour a quantity of developer onto a developing sponge or pad and onto the center of the plate, which quantity is supposedly sufficient to process the plate, and the craftsman then works his sponge from the "reservoir." This procedure may lead to a high degree of contamination of the processing fluids by the removed photosensitive coating as well as a change in the chemistry of the fluid because of evaporation, which will, in turn, either reduce the efficiency of the chemistry resulting in incomplete removal of the undesired coating in highly critical areas of halftones, or increase its potency resulting in image attack.

Further, the development of a two-sided plate by developing one side at a time in a sink and turning the plate over can result in damage to the first developed side by pieces of contaminated material in the sink being forced back into the image or non-image areas of the first developed side when the second side is developed. These defects may not become apparent until the plate is clamped into a printing press and the expense of developing the plate has been incurred. All of these problems become more critical with increasing plate sizes.

Automatic processors are available which overcome the difficulties associated with the conventional hand development of such plates by providing an enclosed developer apparatus which includes a receiving station for receiving a printing plate, a continuous transport system, a developing station in which the developer is applied to both sides of the plate simultaneously and evenly over the complete surface of both sides, including a pre-soak section to soften the coating, a rubbing or scrubbing section consisting of a free-floating assembly of a set of cleaning brushes and a set of velour type cloth coated scrubber pads mounted one above and one below the plate in such a manner as to facilitate easy entrance of the plate between the cleaning brushes and scrubber pads. The entire cleaning and scrubbing assembly is further capable of a reciprocating movement traversely across the surface of the plate, each half in a direction opposite to the other. When no plate is in the developing system, the top and bottom cleaning and scrubbing devices rub against each other. Attached to the end of the assembly are furthermore squeegee means which contact the following transport-squeegee rollers for reasons described below.

Prior to entering the cleaning and scrubbing section as just described, the developer is applied onto both sides of the plate in a unique pre-soak chamber. While the plate is being moved forward through the pre-soak chamber, the coating on the non-image areas is softened, enabling the following cleaning and scrubbing assembly to effectively clean or remove all unwanted coating even in the smallest areas. This assures a highest quality image. Developer is further applied to the plate continuously in the cleaning and scrubbing section, both through the actual cleaning brushes and between the scrubber pads. By reciprocating this entire assembly whereby the top half floats and moves in a direction opposite to the lower half and by continuously introducing developer through the cleaning brushes and into the scrubber pads, the removed coating which would eventually foul the cleaning brushes and scrubber pads is effectively and continuously washed away. However, should small bits of removed coating remain on the plate after exiting the scrubber pads, this coating will be picked off by the following nip rolls which carry the plate from the developing station into the adjacent stations of the processing unit. To accomplish this, the roller pair is covered with a synthetic soft material which has a greater affinity for the removed coating than the metal of the plate. The particles picked off by the roller pair, in turn, are continuously removed by the reciprocating squeegee assembly attached to the scrubbing unit. This roller pair, in addition to propelling the plate forward, serves furthermore as nip rolls to remove excess developer from the plate.

The pre-soak chamber is of such a length that at the speed of travel of the plate, the coating in the non-image areas will be thoroughly softened prior to entering the cleaning and scrubbing section. The developer in this chamber is continuously recirculated and refiltered, thus any material dissolved away in this station is automatically removed from the system.

In the cleaning and scrubbing unit assembly, the plate is continuously supplied with additional developer, as described above, in order to obtain maximum developing efficiency. This developer is also continuously recirculated and continuously filtered in order to keep the developer clean at all times. Specifically, in the brush section of the unit, the developer which is forced in under pressure from both sides adds to the developing action by the hydraulic forces created. These hydraulic forces are also used in conjunction with a weight on the top floating half of the cleaning and scrubbing section to regulate the desired work force exerted by the brushes and pads on the plate surface to attain optimum development. A further benefit of these hydraulic forces which are applied to both sides of the plate resides in helping keep the plate in the center line of travel.

In addition to the problems of hand developing referred to above, it is to be noted that conventional processing of printing plates, whether by hand or by a mechanical apparatus, involves a developing stage, wherein the non-image areas of the photohardenable layer is removed, a rinsing stage, wherein the developing solution is rinsed off with water, a gumming stage, wherein a finisher or gum is applied to afford protection of the plate during storage, and a drying stage, wherein the finished plate is dried. Thus, four separate and distinct processing steps are necessary. However, in accordance with U.S. application Ser. No. 490,848, filed July 22, 1974 by Thomas N. Gillich and August P. Doering and assigned to the Assignee of the present application, a novel composition and method is set forth which combines in a single solution both a developing agent and a preserving agent, thereby eliminating the necessity of the steps of water rinsing and preserving or gumming. It is this essentially single stage developing-preserving operation for which the apparatus of the present invention is primarily useful. However, the novel means of applying developing solution and removing dissolved non-image areas of the plate coating of the present invention is also useful where the developing and gumming or preserving stages are separate. In addition, the apparatus of the present invention can be adapted to process plates which are sensitized and imaged on one side only or on both sides. For purposes of illustration, the present invention will be described in detail with reference to the processing of a plate sensitized and imaged on both sides and utilizing a single stage developing-preserving solution but the variations just mentioned should be kept in mind.

More specifically, the present invention is directed to a novel apparatus for developing sensitized and imaged planographic printing plates comprising a developing means including at least one elongated, rotatable brush means adapted to rotate in a direction counter to the direction of movement of the plate through the apparatus on an axis parallel to the plane of the plate, developing solution dispensing means mounted behind the brush means, with respect to the direction of travel of the plate through the apparatus, and adapted to simultaneously spray developing solution on the brush means and the plate after it has passed the brush means, elongated deflector means having an axis parallel to the axis of the brush means, mounted ahead of the brush means, with respect to the direction of travel of the plate through the apparatus, and in contact with the brush means and adapted to clean non-image coating material from the brush means after the brush means has contacted the plate and removed coating material therefrom, and feed roller means for transporting the plate through the apparatus. Where a combined developer-finisher is utilized as the developing solution, the apparatus consists essentially of the specified developing means, metering means for metering a thin layer of the developer-finisher solution on the plate and drying means for drying the plate.

The present invention has numerous advantages over conventional developing means, particularly when utilizing a combined developer-finisher solution.

In a conventional processing machine, developer dispensing means are mounted ahead of the rotating brush means, with respect to the direction of travel through the apparatus, and spray developer on the bristles of the rotating brush. This arrangement has the effect of the developer fluid being deposited on the brush and being carried by the brush through an arc of about 300° before it actually contacts the plate being pushed past the brush. Further, the arrangement and character of the bristles of the brush are depended upon to flick particles of dirt, specks and flakes of non-image coating off the plate. However, the particles of non-image coating are thus propelled toward nip rollers, designed to remove developer solution and residual particles of non-image coating, when a conventional developer solution is used, or to meter a thin layer of developer-preserver solution on the plate, when a combined developer-finisher solution is used. In either case, the nip rollers have a tendency to redeposit particles of non-image coating, which is a colored resin, and press them onto the image areas. Not only do these particles appear in an unsightly way (an undesirable cosmetic effect) but in more serious cases they are capable of printing and thus making the plate useless.

By contrast, in the apparatus of the present invention, the developing solution impinges upon the bristle tips of the brush and is almost immediately carried to the surface of the plate being processed, thus providing a higher volume of developing solution which is clean. This arrangement also creates a jet action and flow pattern which effectively flushes the plate and carries the developer solution away from scrubbing pads and/or nip rollers mounted behind the brush, with respect to the direction of travel of the plate. Finally, the arrangement also carries contaminants, specks of dirt and particles of non-image coating away from such scrubber pads and/or nip or squeegee rollers and the deflector means cleans residual debris and used developer solution from the brush, so that it is not carried around to the plate as it passes the brush and the developer solution can be filtered before recirculation and reapplication to a plate being processed. Where a combined developer-finisher solution is used, the arrangement described is particularly effective since the plate carries only clean solution after leaving the brush, thus eliminating the necessity of a separate step of flushing the plate with developer-finisher solution after it passes the brush and providing a clean solution to be metered on the plate for protection of the plate during storage.

The invention will be further illustrated by reference to the accompanying drawing in which:

The single FIGURE shows a cross-sectional, side view of the preferred form of the apparatus of the present invention.

In accordance with the drawing, the apparatus is provided with a closed chamber 1 having an inlet 2. Inlet 2 is provided with a flexible, flapper-type closure 3 adapted to maintain the fluid integrity of the apparatus and prevent developer fluid from escaping while at the same time permitting a plate to be processed to enter the apparatus in the direction shown by the arrow. Immediately adjacent entrance 2 is a pair of driven transport rollers 4 and 5 which rotate in the direction of movement of the plate through the apparatus and start the movement of the plate therethrough. Behind transport rollers 4 and 5, with respect to the direction of plate travel through the apparatus, is a pre-soak chamber comprising upper and lower plates 6 and 7, respectively. Plates 6 and 7 form a chamber closed on the sides and open at the entrance end and the discharge end thereof for the plate to enter and exit. This chamber is flooded with developing fluid by means of feed conduits and sprays 8 and 9, which are connected to a suitable source of developer fluid under pressure (not shown). The configuration and size of the pre-soak chamber is such that, when the chamber is flooded with developer fluid, the plate resides in the chamber long enough to soften the non-image areas of the plate which are to be removed by the developing fluid. The terminal or exit end of the chamber is provided with a plurality of guide fingers 10 and 11 which protect the plate and prevent its being bent or damaged and also prevent it from being repelled by counterrotating brushes 12 and 13, forming part of a cleaning and scrubbing means. Counterrotating brushes 12 and 13 have bristles with a herring-bone-type surface and are designed to clean or scrub softened coating from the plate. If desired, axles 14 and 15 of brushes 12 and 13 may be hollow and serve as conduits for the supply of developer fluid through the bristles of the brushes. However, this is not necessary as will be obvious later. Mounted behind brushes 12 and 13, with respect to the direction of travel of the plate through the apparatus, are developer feed conduits 16 and 17 which receive developer fluid from a source of fluid under pressure (not shown) and spray developer fluid onto the bristles of brushes 12 and 13 and onto the plate as it travels between developer supply conduits 16 and 17. This particular arrangement of the conduits 16 and 17 behind the brushes 12 and 13 has numerous distinct advantages over known arrangements of the prior art.

Specifically, the spray of developer fluid impinges upon the bristle tips of brushes 12 and 13 and is almost immediately carried to the surface of the plate rather than being carried around and on the brushes for a substantial portion of their rotation. Consequently, the developer fluid is fresh and clean when it contacts the plate, a high volume of fluid is supplied and a very effective cleaning action results. As a consequence also, a jet action and flow pattern is developed which effectively flushes the plate, thus eliminating a separate and distinct flushing operation, as sometimes carried out in the prior art and carries used developer fluid away from the path of the developer units which follow. Maintenance of the cleanliness of the fluid that contacts the plate is aided by deflectors 18 and 19 which are in contact with the tips of the bristles of brushes 12 and 13, respectively. Deflectors 18 and 19 thus clean the counterrotating brushes 12 and 13 so that dirt, particles of non-image coating, etc. are not carried around by the brushes and reapplied to a plate or redeposited in the fresh developer fluid being supplied by conduits 16 and 17. Thus, contaminated developer solution and its contaminants are thrown forward in the apparatus, with respect to the direction of travel of the plate, as shown by the spray patterns leading from deflector 18 to splash pan cover 20 and deflector 19 to developer fluid collecting tray 21. The contaminated developing fluid together with its contaminants are thus collected in tray 21, removed through conduit 22 and filtered and recirculated by apparatus not shown. After passing between supply conduits 16 and 17, the plate passes between reciprocating scrubber pads 23 and 24 which are provided with a suitable soft material, such as velour, to scrub residual non-image coating from the plate. Scrubber pads 23 and 24 are provided with developer fluid conduits 25 and 26, respectively, which are connected to the source of developer fluid under pressure and force developer fluid through the pads and onto the plate to thus effectively remove any remaining portions of non-image coating. Brushes 12 and 13 and scrubber pads 23 and 24 are supported by interconnected brackets 29 and 30, to thus form a cleaning and scrubbing unit. Brackets 29 and 30 are, in turn, supported on rod 31, which is designed to be reciprocated parallel to the axes of brushes 12 and 13 and scrubber pads 23 and 24 by a reciprocating apparatus (not shown). Upper brush 14 and pad 23 may be reciprocated in the same direction as lower brush 15 and pad 24 but it is preferable that the upper elements be reciprocated in a direction opposite to that of the lower elements. In addition, upper pad 23 is mounted on bracket 30 in a free floating manner in a construction of the type shown in U.S. Pat. No. 3,906,536 so that the forces applied by the pads are essentially the weight of the upper pad and the upward reactive force thereto. If it is necessary or desirable to add weight to the upper pad 23, weights (not shown) may be added to top of this pad. After passing between scrubber pads 23 and 24, the plate passes between driven transport rollers 32 and 33, respectively, which transport the plate through the apparatus and also remove excess developer fluid from the plate. In the case where a combined developer-finisher fluid is used, the transport rollers are designed to meter a thin layer of the developer-finisher fluid onto the plate. Rolers 32 and 33 preferably have a surface, such as synthetic rubber, which selectively attracts any residual specks of loosened coating, etc., which may be present on the plate. Any specks of coating or the like picked up by rollers 32 and 33 are removed from the rollers by means of cleaning pads 34 and 35, respectively, which form an integral part of scrubber pads 23 and 24 and are reciprocated therewith.

Reverting again to the arrangement of the rotary brushes 12 and 13, developer fluid supply conduits 16 and 17 and deflectors 18 and 19, it is significant to note that the cooperation of these elements prevents the redeposit of dirt, specks and flakes of non-image coating on the plate, prevents such debris from being carried through the scrubber pads and possibly damaging the plate and through the rollers 32 and 33 which will have a tendency to press such particles of the debris into the surface of the plate. This redeposit of non-image coating normally results in a colored resin being pressed onto image and non-image areas of the plate. This not only shows on the plate in an unsightly way (an undesirable cosmetic effect) but, in more serious cases, is capable of actually accepting ink and printing in non-image areas. Thus, the plate can be made completely useless in the extreme case.

The plate leaves rollers 32 and 33 and passes into a drying chamber through flexible closure 36. Closure 36 prevents heat from the drying chamber from entering the remainder of the apparatus and also maintains the integrity of the drying chamber, thereby improving its effectiveness. Hot air is supplied to the drying chamber through conduits 37, located in the sides of the drying chamber. The plate is guided through the drying chamber along guide fingers 38. The plate then passes between driven transport rollers 39 and 40 and is discharged from the apparatus through discharge opening 41. Transport rollers 39 and 40 are segmented in character to thus provide passages through which the hot drying air may pass toward exit 41.

As previously indicated, the novel arrangement of the present apparatus can be utilized to effectively remove softened coating from a printing plate and prevent redeposit of removed coating particles irrespective of what type of developer fluid is being utilized. It is also clear that while the apparatus shown is designed to process both sides of a plate which is sensitized and imaged on both sides or a pair of back-to-back plates, the apparatus can also be utilized to process a plate sensitized and imaged on one side only by simply eliminating the upper or lower ones of the working parts. Even more significant is the fact that, when a combination developer-finisher fluid is utilized, the apparatus consists only of a developing section, a section for metering a thin coating of the fluid on the plate and a section for drying the plate. Thus, sections designed to flush the plate with developer fluid after passage through the cleaning brushes and/or the scrubber pads, sections to rinse the plate with water and remove the last traces of developer fluid and sections to gum the plate and put a protective coating thereon are completely eliminated. It should also be recognized that, while the brushes are shown to be reciprocatable, this is not necessary to effective cleaning.

It will be obvious to those skilled in the art that many modifications may be made within the scope of the present invention without departing from the spirit thereof, and the invention includes all such modifications.

What is claimed is:

1. Apparatus for processing a printing plate comprising, at least one cleaning and scrubbing means including a rotatable brush means rotatably mounted on an axis parallel to the plane of a plate being processed, adapted to rotate in a direction opposite to the direction of travel of said plate through said apparatus and adapted to contact said plate as it travels through said apparatus, said cleaning and scrubbing means including deflector means mounted in contact with and in front of said brush means, with respect to the direction of travel of the plate through said apparatus, and adapted to clean solid debris from said brush means as it contacts said deflector means, and processing fluid distributing means mounted adjacent to and behind said cleaning and scrubbing means, with respect to the direction of travel of said plate through said apparatus, and adapted to spray said processing fluid onto the bristles of said brush means just prior to the time said brush means rotates into contact with said plate.

2. Apparatus in accordance with claim 1 which additionally includes dryer means mounted behind the cleaning and scrubbing means, with respect to the direction of travel of the plate through the apparatus.

3. Apparatus in accordance with claim 2 wherein the dryer means includes a chamber and means for supplying hot air through the sides of said chamber.

4. Apparatus in accordance with claim 1 wherein said apparatus is adapted to process two sides of a printing plate and the cleaning and scrubbing means comprises opposed rotary brushes with deflector means, fluid distributing means, and scrubber pad means, said cleaning and scrubbing means being adapted to clean and scrub both sides of said plate simultaneously.

5. Apparatus in accordance with claim 4 which additionally includes a pre-soak chamber having an inlet and outlet, adapted to maintain a body of processing fluid in continuous contact with both sides of the plate until the areas of the coating of the plate which are to be removed are softened and mounted in front of the cleaning and scrubbing means with respect to the direction of travel of said plate through said apparatus.

6. Apparatus in accordance with claim 4 which additionally includes dryer means mounted behind the cleaning and scrubbing means, with respect to the direction of travel of the plate through the apparatus.

7. Apparatus in accordance with claim 6 wherein the dryer means includes a chamber and means for supplying hot air through the sides of said chamber.

* * * * *